United States Patent [19]
Gilbert

[11] Patent Number: 5,077,541
[45] Date of Patent: Dec. 31, 1991

[54] VARIABLE-GAIN AMPLIFIER CONTROLLED BY AN ANALOG SIGNAL AND HAVING A LARGE DYNAMIC RANGE

[75] Inventor: Barrie Gilbert, Portland, Oreg.

[73] Assignee: Analog Devices, Inc., Norwood, Mass.

[21] Appl. No.: 567,255

[22] Filed: Aug. 14, 1990

[51] Int. Cl.⁵ .............................................. H03G 3/00
[52] U.S. Cl. .................................... 330/284; 330/144
[58] Field of Search ...................... 330/144, 145, 284; 333/81 R; 455/249

[56] References Cited

U.S. PATENT DOCUMENTS

| | | | |
|---|---|---|---|
| 4,475,169 | 10/1984 | Gilbert | 364/817 |
| 4,476,538 | 10/1984 | Gilbert | 364/817 |
| 4,521,764 | 1/1985 | Burton | 323/283 X |

FOREIGN PATENT DOCUMENTS 8203979  5/1984  Netherlands ...................... 330/284

*Primary Examiner*—James B. Mullins
*Attorney, Agent, or Firm*—Parmelee, Bollinger & Bramblett

[57] ABSTRACT

A variable-gain amplifier including a ladder attenuator to which the input signal is applied. The ladder nodes develop progressively attenuated (reduced level) signals corresponding to the input signal. Controllable-transconductance ($g_m$) stages are connected respectively to the ladder nodes, and a composite of their outputs is directed to a fixed-gain output amplifier. The transconductances of the $g_m$ stages are controlled by an interpolator circuit which steers a control current to each of the $g_m$ stages in sequence in response to an analog control signal as it is varied between minimum and maximum attenuation values. The control current activates each $g_m$ stage in sequence, raising the transconductance of each from effectively zero to maximum and then back to zero, in an overlapping fashion, so as to smoothly lower the overall gain of the variable-gain amplifier as the control signal is swept through its control range.

14 Claims, 10 Drawing Sheets

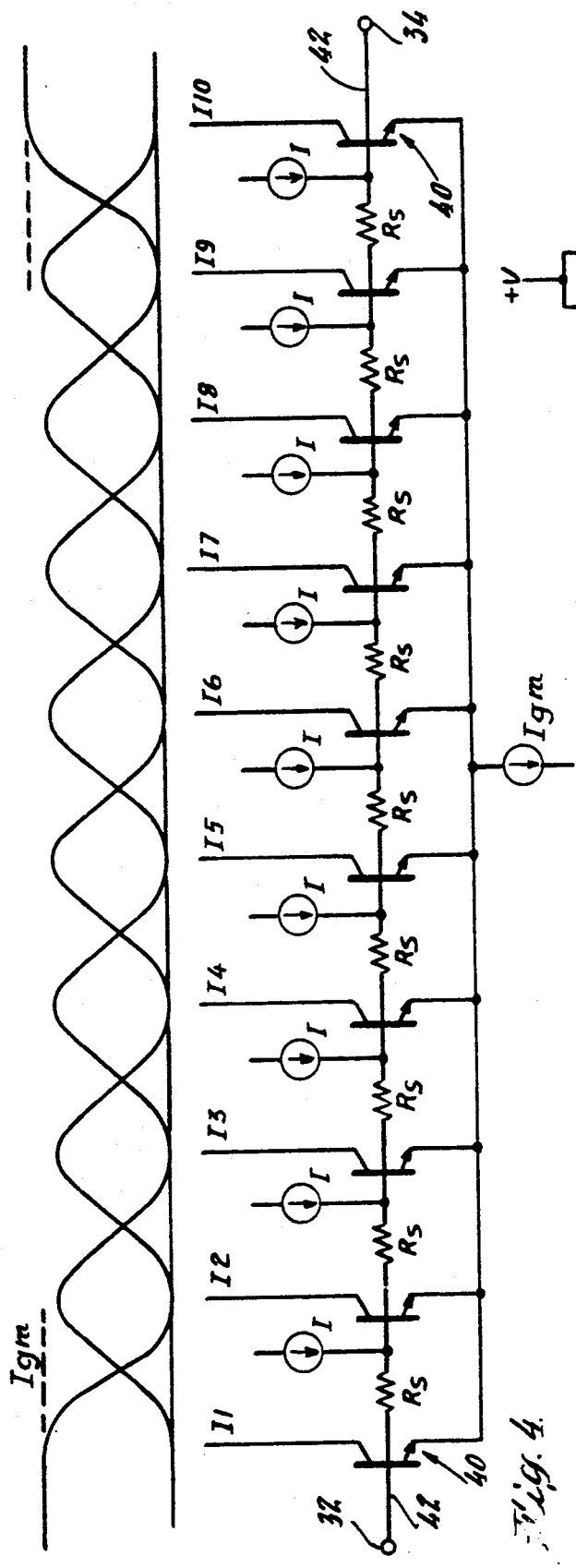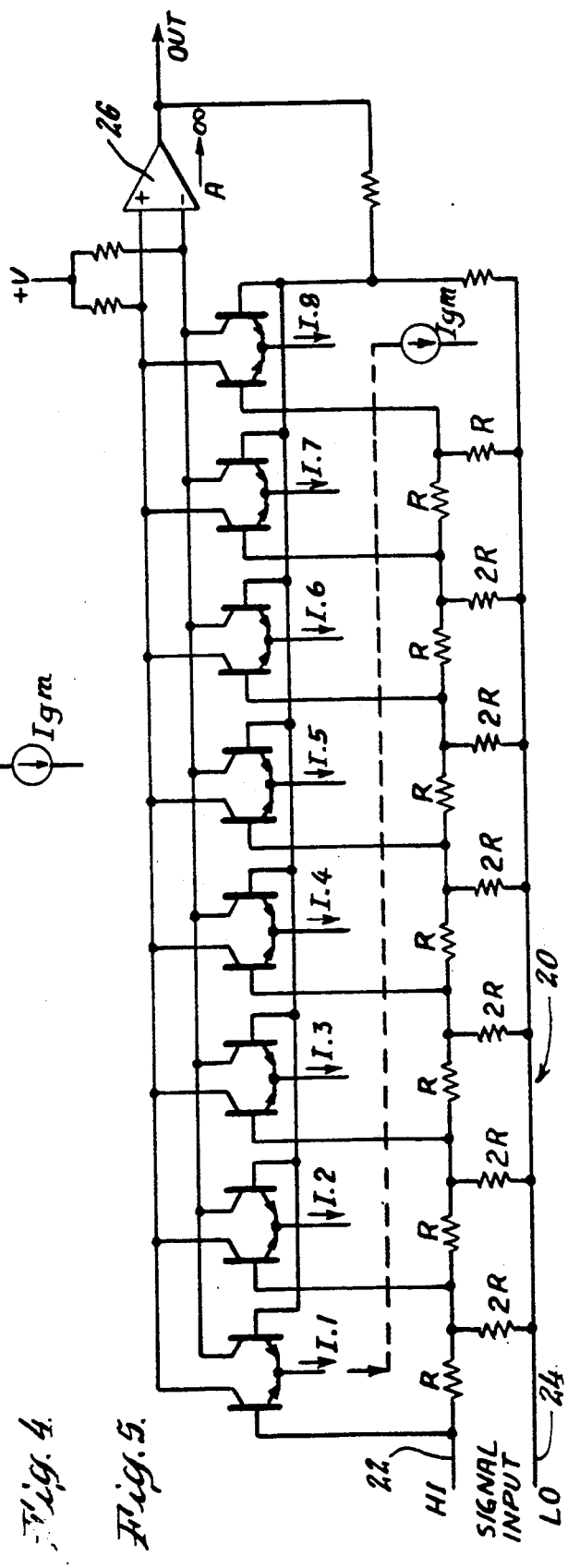
Fig. 4.
Fig. 5.

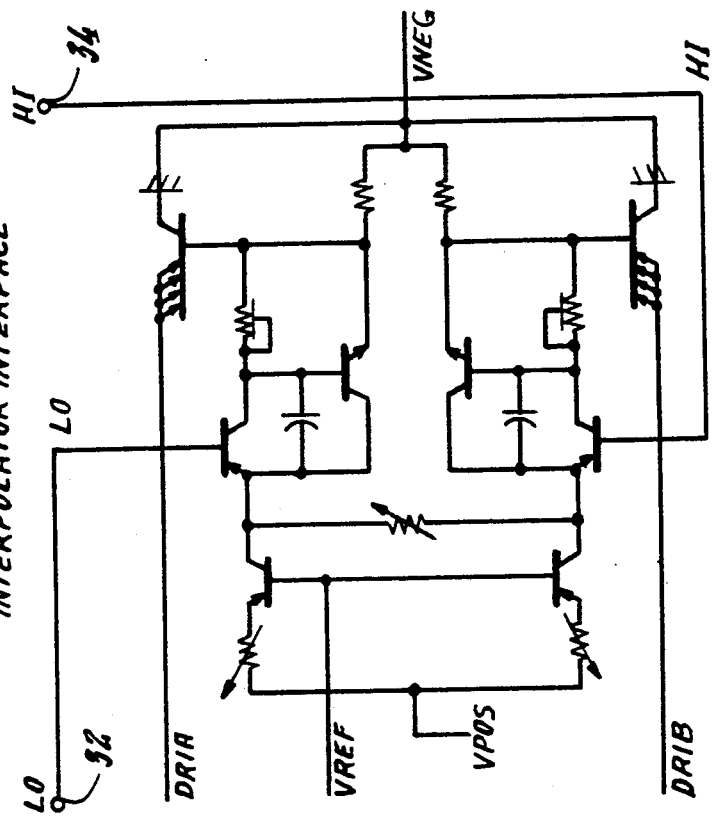
Fig. 10. BLOCK 200 INTERPOLATOR INTERFACE
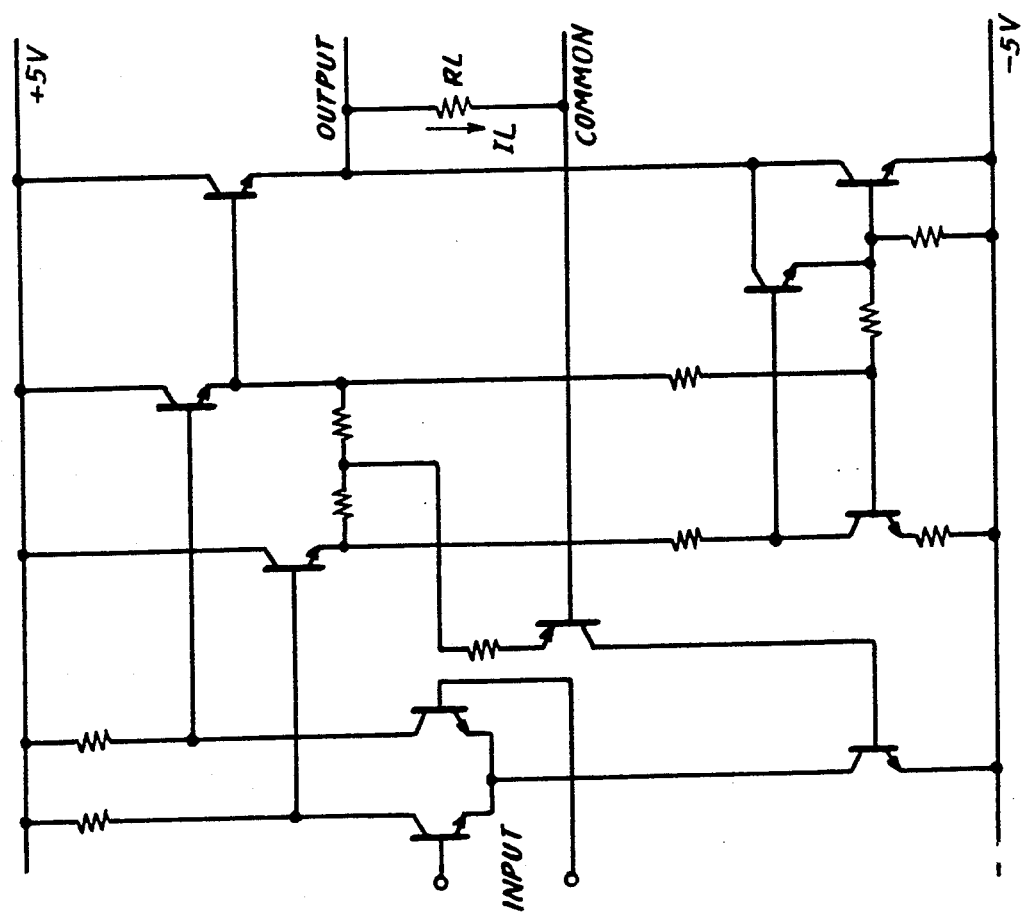
Fig. 8.

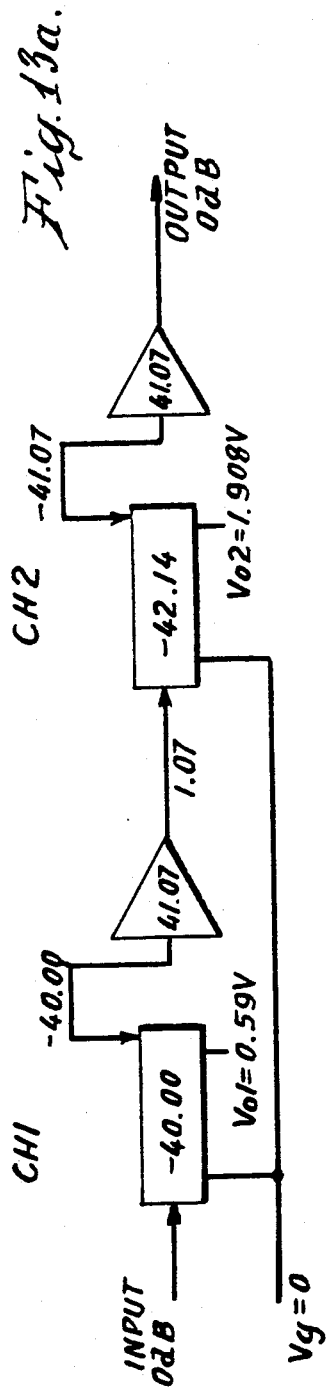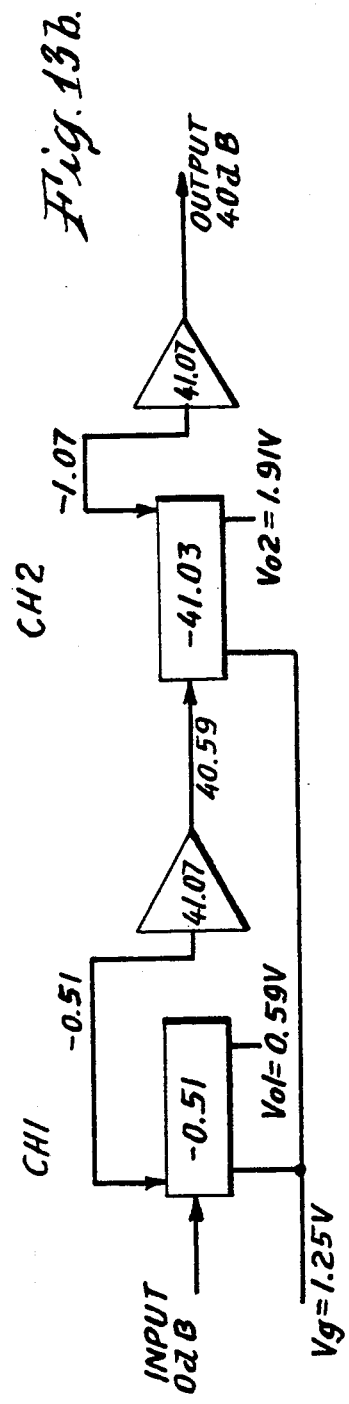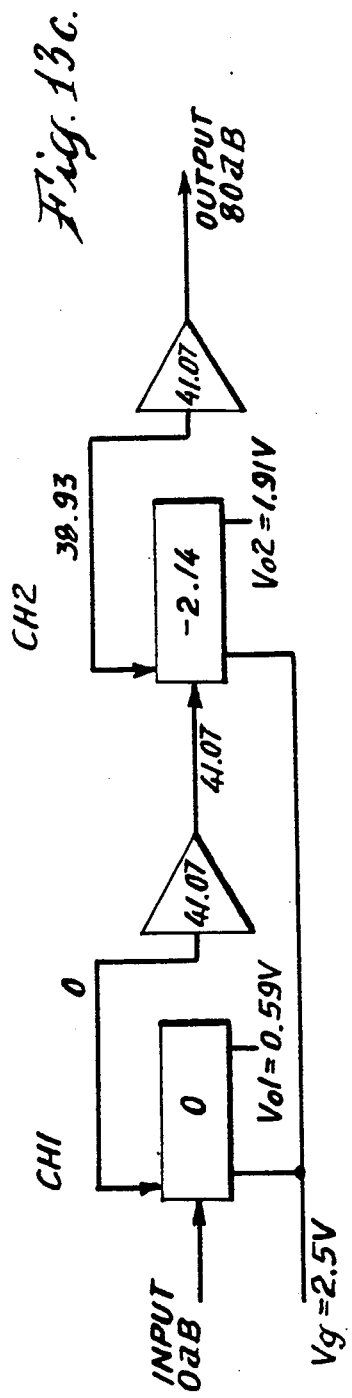

VARIABLE-GAIN AMPLIFIER CONTROLLED BY AN ANALOG SIGNAL AND HAVING A LARGE DYNAMIC RANGE

BACKGROUND OF THE INVENTION

1. Field of the Invention

This invention relates to variable-gain amplifiers having very high dynamic range and low distortion. More particularly, this invention relates to such amplifiers where the gain can be varied exactly exponentially by an analog control signal, for example, to provide a swept-gain amplifier for use in ultrasound imaging equipment having medical applications.

2. Description of the Prior Art

Variable-gain amplifiers have been used for many years, and a wide variety of techniques have been employed for controlling the gain. The subject is so central to the topic of signal processing that the literature is too extensive to summarize with any brevity. However, it does appear that one common theme in many analog variable-gain techniques is the employment of non-linear circuit elements directly in the signal path, e.g., use of the exponential relationship between collector current and base-emitter voltage in a bipolar junction transmitter. All such non-linear schemes, however, have relatively poor accuracy, in particular, residual non-linearity, which often is caused by non-ideal aspects of transistor behavior and the necessity for an open-loop signal path.

SUMMARY OF THE INVENTION

In a preferred embodiment of the invention to be described hereinbelow in detail, the amplifier signal passes only through circuit components which are essentially linear. There are three basic components: (1) a resistive attenuator, to which the input signal is applied, (2) means to set the attenuation factor of the attenuator to any value within a continuous wide range of values, and (3) a fixed-gain amplifier receiving the attenuated signal and producing the final output.

Although the signal passes only through linear components, the complete IC design of the system is not without any non-linear aspects. For example, because a large gain-control range is required, there is need for a decibel-based (rather than linear) control function. A typical scaling might for example provide a change of 20 dB in gain for each volt of control input. However, this exponential gain law is built into the attenuator network, and is not the result of employing a non-linear element, nor is it dependent upon any special exponential properties of transistors.

In one particular preferred embodiment described herein, the attenuator is a multi-section R-2R ladder network to one end of which the input signal is applied. The ladder nodes provide respective output points which deliver progressively lower (i.e., more attenuated) output voltages. The effective "tap" point of this attenuator is continuously interpolated between and along the ladder nodes (in a manner somewhat comparable to the function of a potentiometer) by a gain-control circuit comprising a set of current-controllable transconductance ($g_m$) stages, which form the input stage of a feedback amplifier.

Each of these $g_m$ stages receives its input signal from a corresponding node of the ladder attenuator. The transconductances of the individual stages are controlled by a continuously-variable analog control signal in a way which effectively "moves" the "tap" point down along the ladder nodes, thereby continuously increasing the net attenuation of the overall amplifier as the analog control signal changes. The transconductances of the $g_m$ stages are varied by a steerable control current which is directed to each stage in sequence in a smoothly changing manner. While the transconductance of one stage is increasing, that of the preceding stage is diminishing, and so on down the line of the $g_m$ stages. Since the successive $g_m$ stages receive their input signals from nodes progressively further down the ladder attenuator (thus receiving progressively further attenuated input signals), the overall gain is smoothly lowered by steering the control current to successive $g_m$ stages in such a way as to activate/deactivate those stages in overlapping sequence.

The gain range of the overall variable-gain amplifier may be viewed as being sub-divided into successive segments, with each segment having its own $g_m$ stage connected to a corresponding node of the attenuation ladder. Applying a swept control voltage to the gain-control circuit will activate each segment amplifier in turn, by increasing and then decreasing the transconductance of that stage. Such increase/decrease in transconductance occurs to the respective $g_m$ stages in succession, in an overlapping fashion, to provide the desired smooth reduction in overall gain.

The steered "movement" of the control current along the sequence of gm stages in response to such a continuously-changing (swept) control signal is effectively linear. That is, the amount of shifting of the control current progressively down along the "line" of $g_m$ stages is linearly related to the magnitude of the applied control signal.

Accordingly, it is an object of this invention to provide an improved variable-gain amplifier. Other specific objects, aspects and advantages of the invention will in part be pointed out in, and in part apparent from, the following description considered together with the accompanying drawings.

BRIEF DESCRIPTION OF THE DRAWINGS

FIG. 4 is a graphical presentation to show how the $g_m$ stage control currents vary with changes in the applied control signal;

FIG. 5 is a simplified schematic diagram illustrating the arrangement of a preferred commercial design;

FIG. 8 is a simplified schematic of an operational amplifier suitable for use in the variable-gain amplifier of FIG. 6;

FIG. 10 is a schematic diagram of an interpolator interface circuit for use in the variable-gain amplifier of FIG. 7;

FIGS. 13a, 13b, and 13c show a two-channel variable-gain amplifier under different signal conditions.

DESCRIPTION OF A PREFERRED EMBODIMENT

Figure 1:
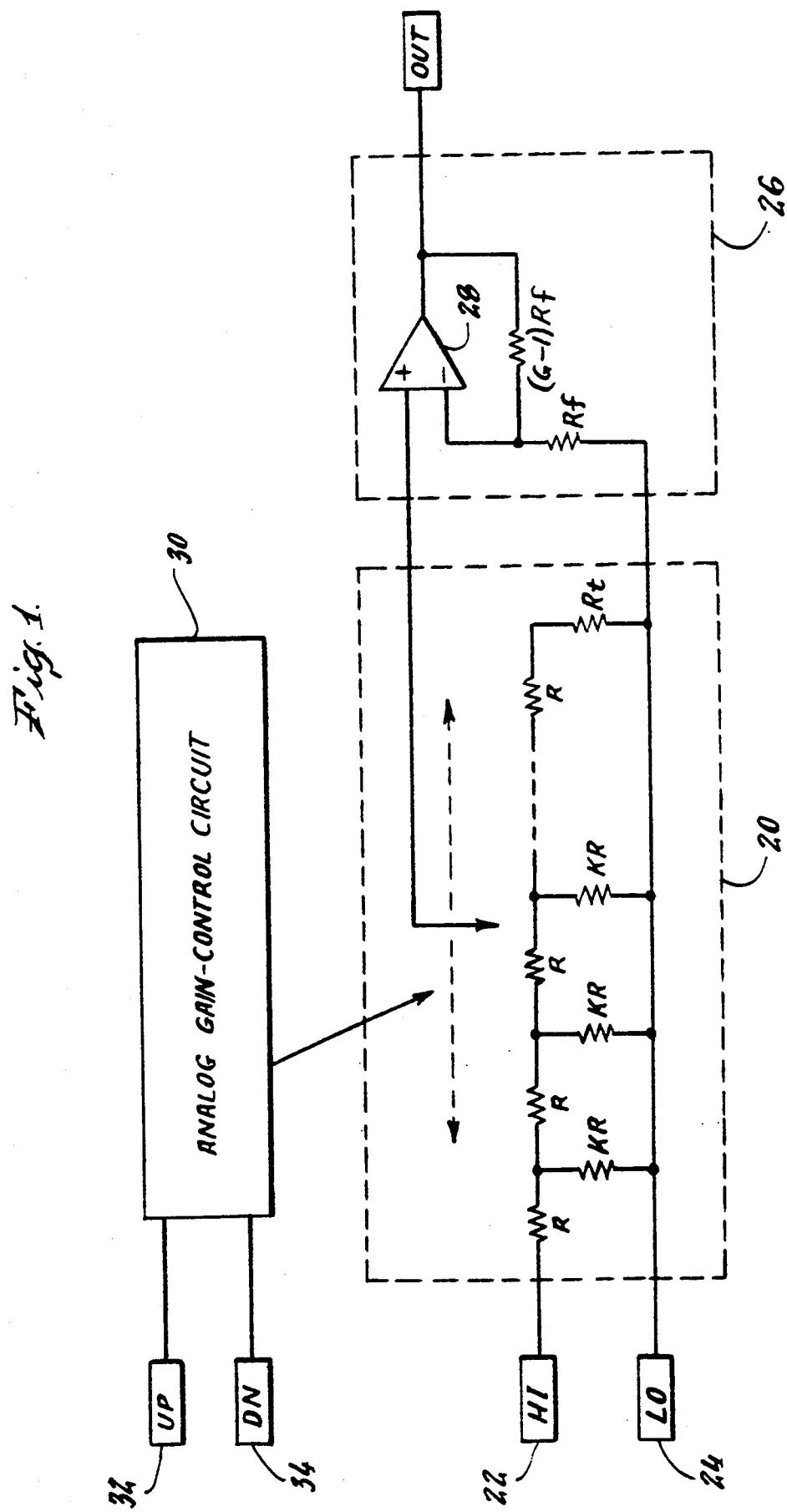
FIG. 1 is a simplified block diagram showing a variable-gain amplifier in accordance with this invention.

Referring now to FIG. 1, there is shown a variable-gain amplifier comprising a resistive attenuator 20 which receives an input signal at terminals 22, 24 and delivers a corresponding attenuated signal to a precision fixed-gain amplifier generally indicated at 26 comprising a high-gain operational amplifier 28 with a negative feedback circuit (the parameters of which are given in generalized form). The attenuator is illustrated as a ladder network with generalized resistor values R and kR and with a termination resistor Rt. The attenuation factor of the attenuator is set by a gain-control circuit 30 in response to an analog signal applied to terminals 32, 34.

Figure 2:
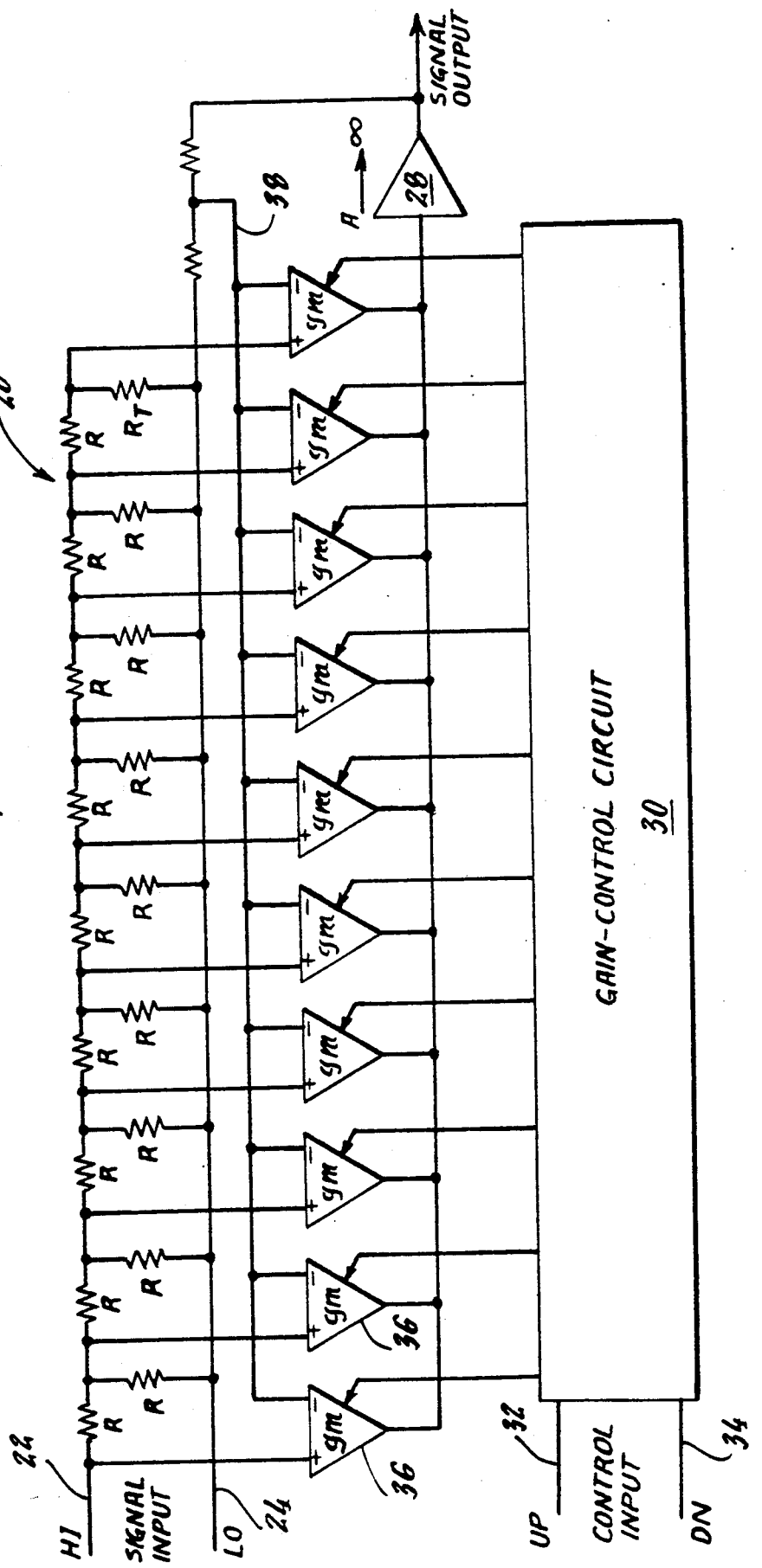
FIG. 2 is a block diagram showing a variable-gain amplifier with a series of gm stages driven by respective nodes of a ladder attenuator network.

FIG. 2 is a further development of the variable-gain amplifier arrangement of FIG. 1. Here the resistive attenuator 20 comprises a ladder network composed of equal-valued resistors R. The voltages at the ladder nodes are supplied to the inputs of respective transconductance ($g_m$) stages 36, serving as input stages of the amplifier 26. The transconductances of these $g_m$ stages 36 are varied by respective control currents from the gain-control circuit 30.

The successive nodes of the ladder attenuator 20 deliver progressively lower (i.e. more attenuated) output voltages corresponding to the applied input signal. The effective "tap" point of this attenuator is continuously interpolated between (and along) the ladder nodes by the gain-control circuitry 30, which thus is sometimes referred to herein as an "interpolator".

Figure 3:
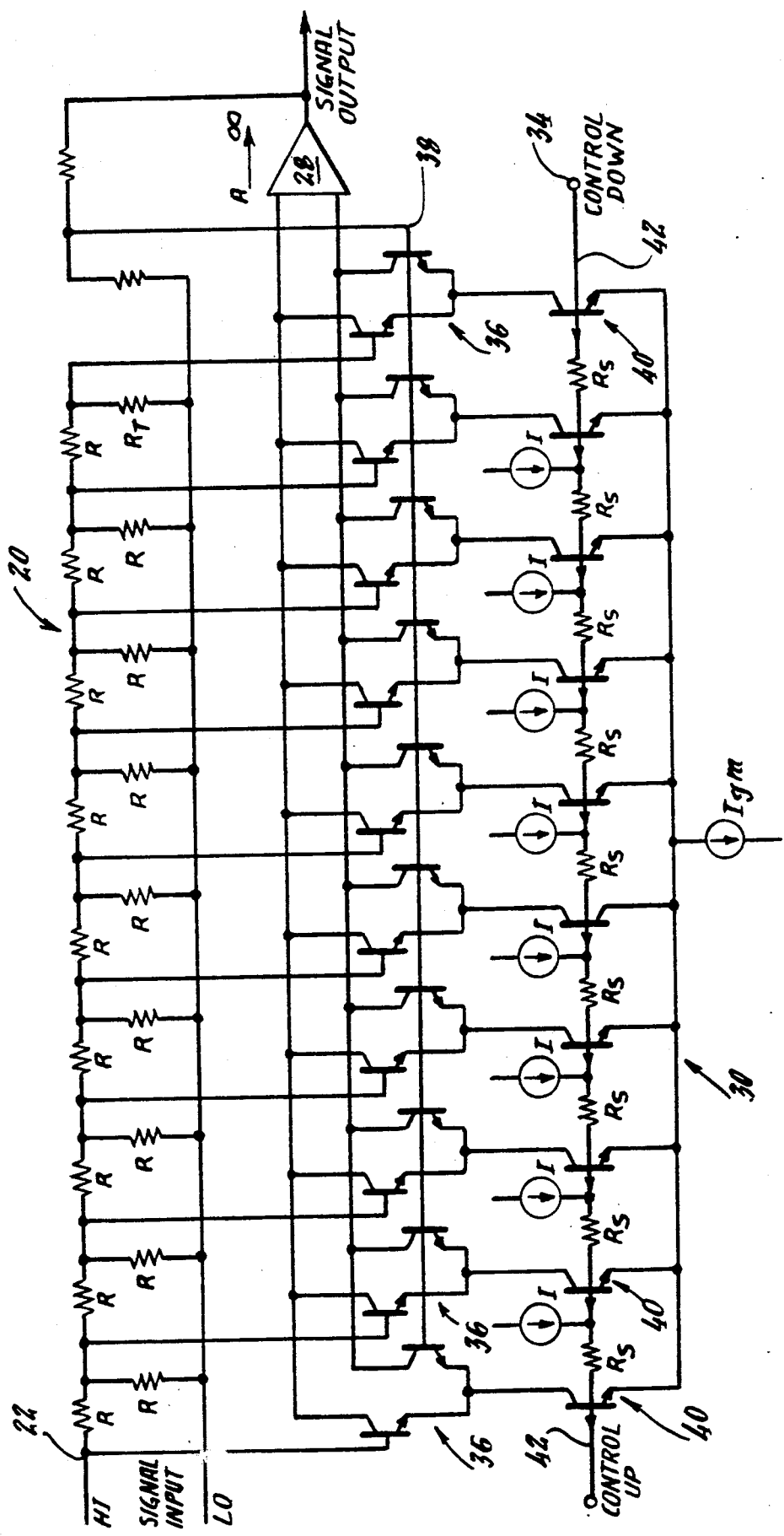
FIG. 3 is a simplified circuit diagram illustrating an arrangement for controlling the gain of the $g_m$ stages of FIG. 2.

In FIG. 3, the $g_m$ stages 36 are further developed as differential pairs of bipolar transistors, by way of illustration, with one transistor of each pair driven by a corresponding ladder node, and the other transistor of each pair driven by a feedback line 38 from the output of the high-gain operational amplifier 28. The input signal for this amplifier is a composite of the signals supplied by the collectors of the $g_m$ stages.

The transconductances of the $g_m$ stages 36 are controlled by a fixed-magnitude control current $Ig_m$ which is steerable to the common emitters of each of the $g_m$ stages in sequence by respective transistors 40 of the interpolator 30. The magnitudes of the currents delivered by these transistors are controlled by the transistor base voltages which in turn are determined in part by currents I flowing through a set of series resistors $R_s$ in a common base line 42, and in part by the superposed control voltage applied at the ends 32, 34 of that base line.

With equal biasing currents I supplied to the string of equal base resistors Rs (and with zero control voltage at terminals 32, 34), the base voltages of the transistors 40 will vary in such a way that their values (if shown graphically) will fall on a parabolic curve, low at each end of the resistor string, and reaching a peak in the middle. A control voltage applied to the ends 32, 34 of the resistor string 42 will shift the peak along the line of $g_m$ stages. As the control voltage is swept through its control range, it will successively alter the individual $g_m$ stage interpolator currents to cause them to vary successively through their respective control ranges. That is, the transconductance of each $g_m$ stage is varied from essentially zero to maximum and then back to zero.

FIG. 4 shows just the circuitry of the interpolator 30. Above that circuitry (and aligned therewith) are sketches of the corresponding waveforms of the collector currents of the transistors 40 (i.e., the interpolator currents for the respective $g_m$ stages 36) which are developed by varying through its full range the control signal applied to the ends 32, 34 of the resistor string line 42. These waveforms closely approximate a Gaussian form by analysis of this circuit, and under practical conditions of use.

Applying a control signal to the terminals 32, 34, shifts the resistor-string voltage peak away from the middle of the base line 42, either left or right, depending on the polarity of the applied control voltage (considered as a differential signal). When the control voltage level is set for minimum attenuation, only the first (left-hand) $g_m$ stage 36 will be activated, by application of the maximum interpolator current ($Ig_m$) to the common emitters of that differential pair. All other stages have either no interpolator current or a negligibly low value of current, such that they do not significantly contribute to the signal response This condition provides the highest gain for the variable-gain amplifier. In this circumstance, the + input terminal (FIG. 2) of the left-hand $g_m$ stage 36 receives the full input signal from the attenuator input terminal 22, while the − input terminal of that $g_m$ stage is connected to the feedback network associated with the operational amplifier 28.

If now the control signal is changed so that only the second $g_m$ stage 36 is activated, the overall gain is reduced because the + input of the second $g_m$ stage (FIG. 2) is taken from the first attenuator tap (i.e., the first ladder node), rather than from the ladder input terminal 22. With the FIG. 2 ladder having equal resistors (K=1), the reduction in gain will be 8.36 dB. When using K=2, the reduction in gain will be 6.02 dB. By successively steering the current $Ig_m$ to each of the following $g_m$ stages, the gain can be progressively lowered until, when the last (right-hand) $g_m$ stage 36 is selected, the gain will be lowered (in the FIG. 2 embodiment using nine attenuator sections with K=2) by slightly more than 75 dB.

The full-gain range of the variable-gain amplifier can be considered to be sub-divided into successive segments, with each segment having its own $g_m$ stage 36 with its input connected to a corresponding node of the ladder 20. As the control voltage is varied from its minimum attenuation level, each segment stage will be activated in succession, with its response increasing from effectively zero to maximum and then back to zero. This successive activation occurs in an overlapping fashion, so as to provide for smooth changes in gain.

Referring again to FIG. 4, it will be seen that the interpolating currents for the $g_m$ stages 36 overlap. With the full magnitude of the source current $Ig_m$ equally divided between two adjacent $g_m$ stages, the resultant net gain will lie somewhere between the two values provided by either tap taken one at a time. By gradually transferring $Ig_m$ from one gm stage to the next, it will be seen that the gain can be made to slide from that obtained at one tap point to that at an adjacent tap point.

Figure 6:
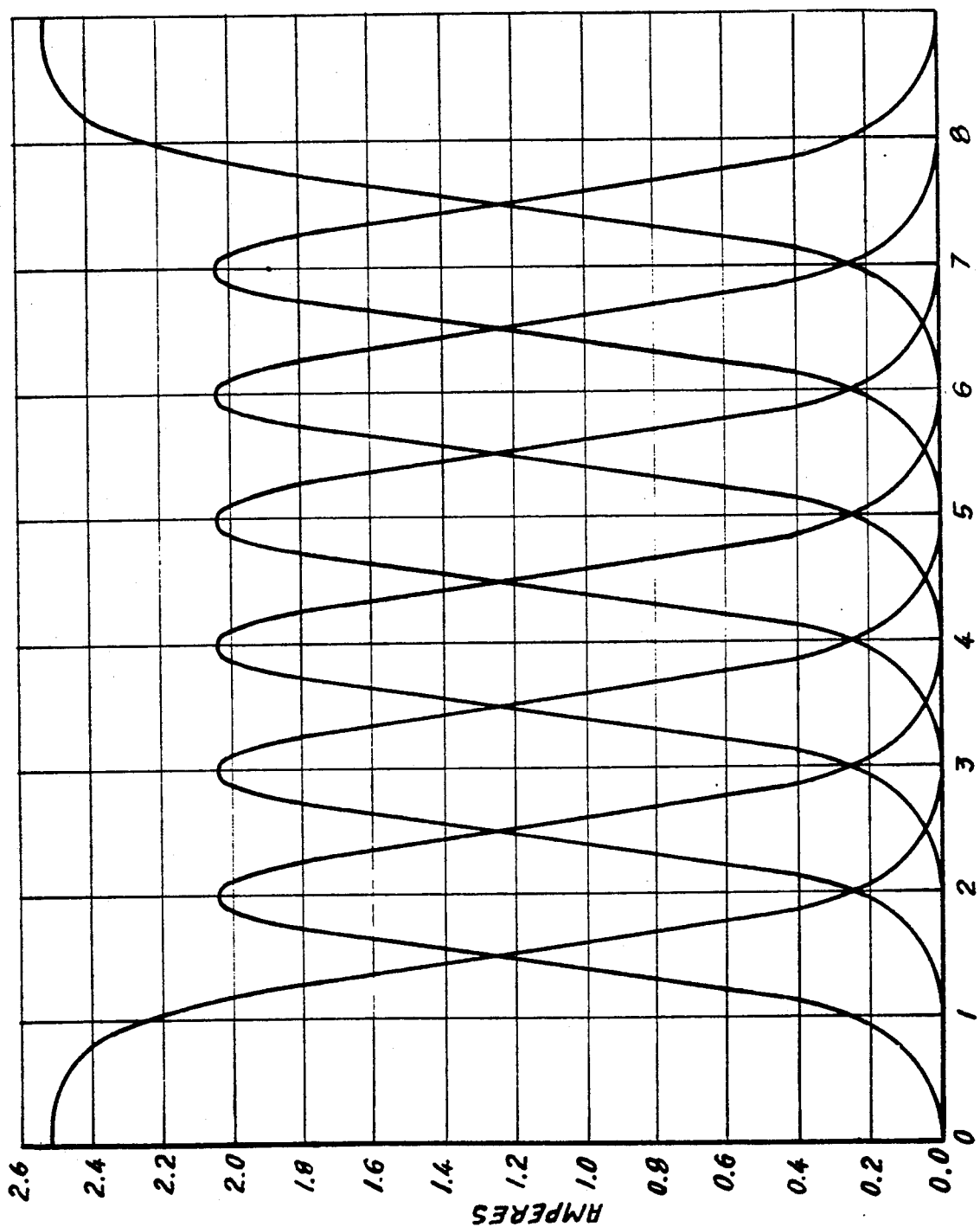
FIG. 6 is a graphical presentation showing the changes in control (interpolator) currents for the $g_m$ stages of the design of FIG. 5.

In a presently preferred commercial design incorporating the invention, the attenuator comprised an R-2R ladder (K=2) with 7 sections. As illustrated in FIG. 5, this arrangement employed eight $g_m$ stages. The movable "tap" point for the attenuator is indicated by a dotted line connected to the current source $Ig_m$ FIG. 6 shows graphically the variations in interpolator currents for the eight $g_m$ stages of this design with changes in the control voltage applied to the interpolator (not specifically shown in FIG. 5).

Figure 7:
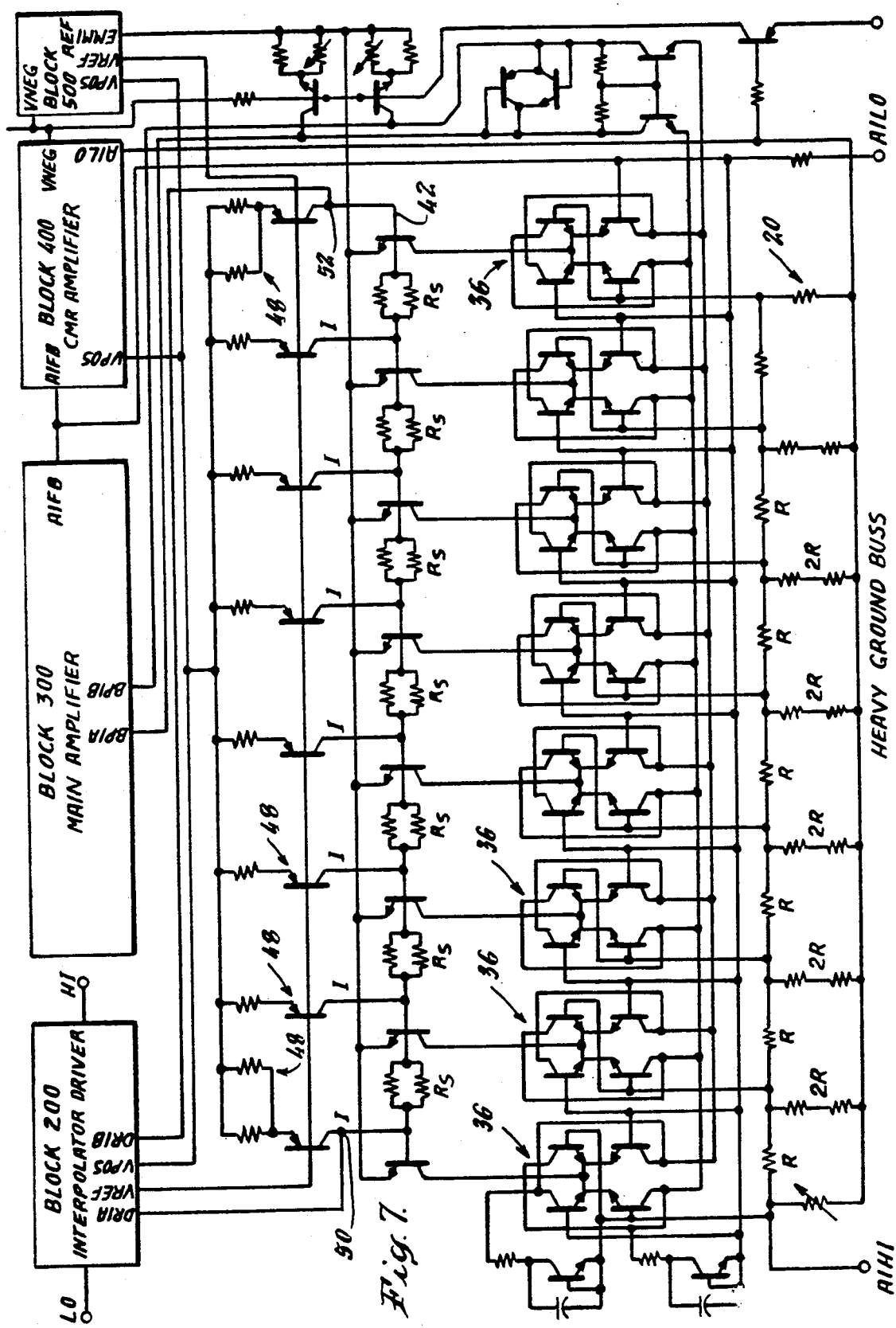
FIG. 7 is a schematic diagram presenting details of the commercial arrangement of FIG. 5.

A circuit diagram showing detailed aspects of the FIG. 5 arrangement is presented in FIG. 7. This circuit shows the current sources 48 for producing the currents I directed to the resistor string in the base line 42. Paralleled transistor pairs are used for the $g_m$ stages 36 to achieve very low offset voltages and low noise. This circuit includes additional amplification for the outputs of the $g_m$ stages.

Figure 9:
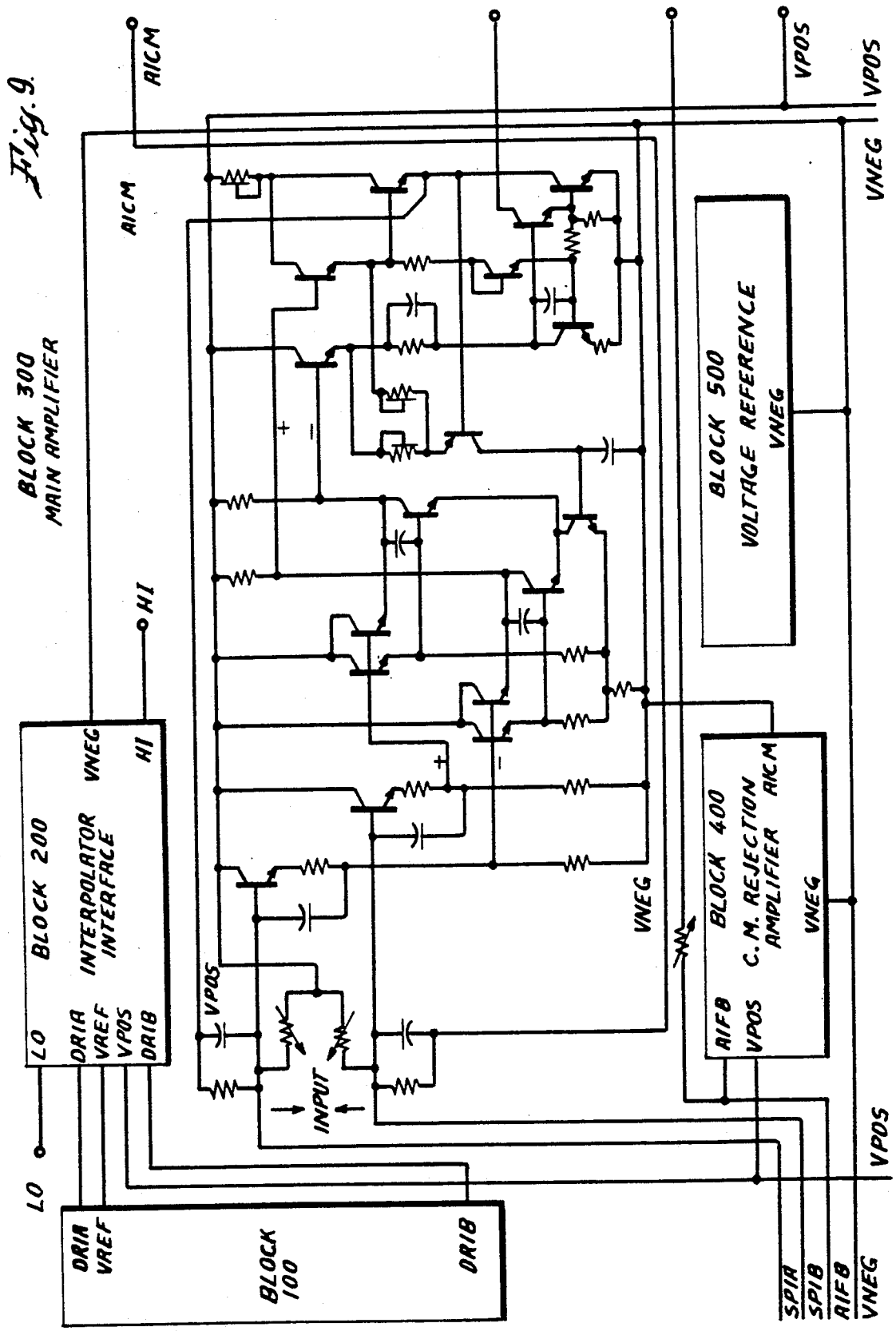
FIG. 9 is a schematic diagram showing details of the operational amplifier of FIG. 8, together with details of its interconnections with other parts of the system.

A simplified circuit diagram of the output amplifier used with the FIG. 7 configuration is shown in FIG. 8. Details of the operational amplifier ar presented in FIG. 9, together with interconnections to other parts of the system.

In the preferred commercial design, an interpolator interface circuit is employed between the control signal terminals 32, 34 (FIG. 2) and the end terminals 50, 52 for the resistor string line 42 (FIG. 7). This interface circuit is shown in FIG. 10, with the signal lines to be connected to the end terminals of the resistor string line 42 designated DR1A and DR1B.

Figure 11:
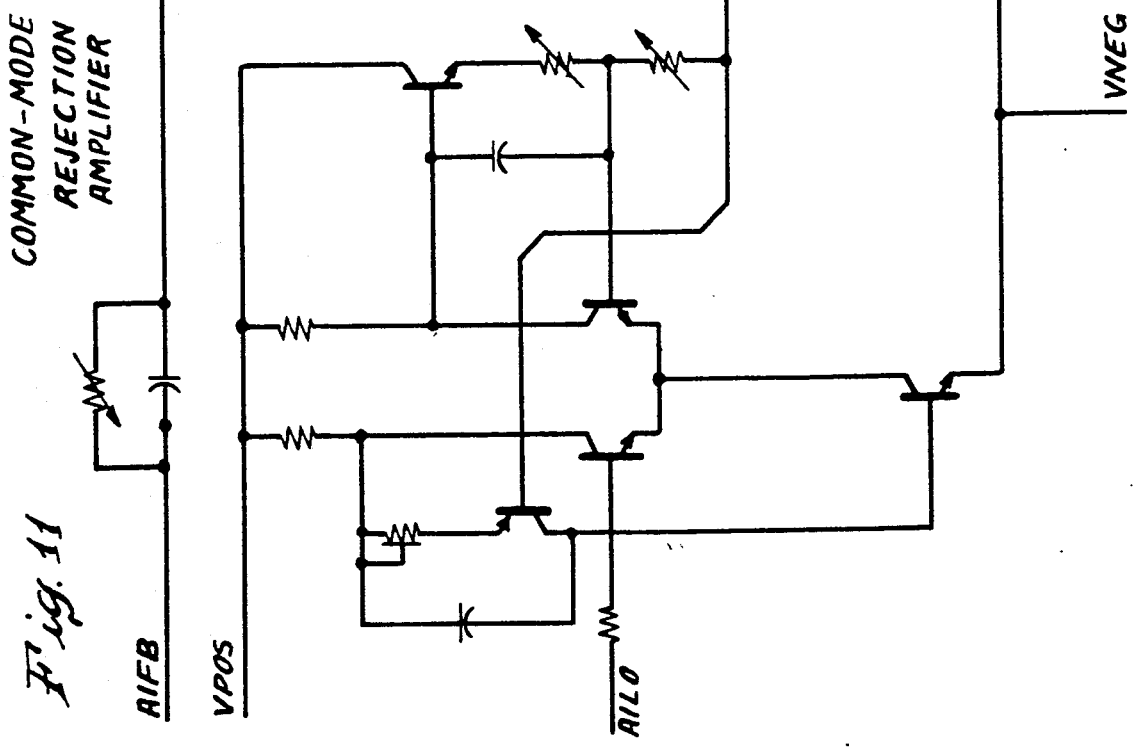
FIG. 11 is a common-mode rejection amplifier which can be used with the variable-gain amplifier of FIG. 7.

The preferred commercial design also included a common-mode rejection amplifier. A circuit diagram of that amplifier is shown in FIG. 11. Its function is essentially to eliminate the response to noise and hash between the separate input and output grounds. It functions as a wideband difference amplifier, which has as its input the voltage difference between A1LO (the input ground) and A1CM (the output ground, which also functions as a DC common connection.

Figure 12:
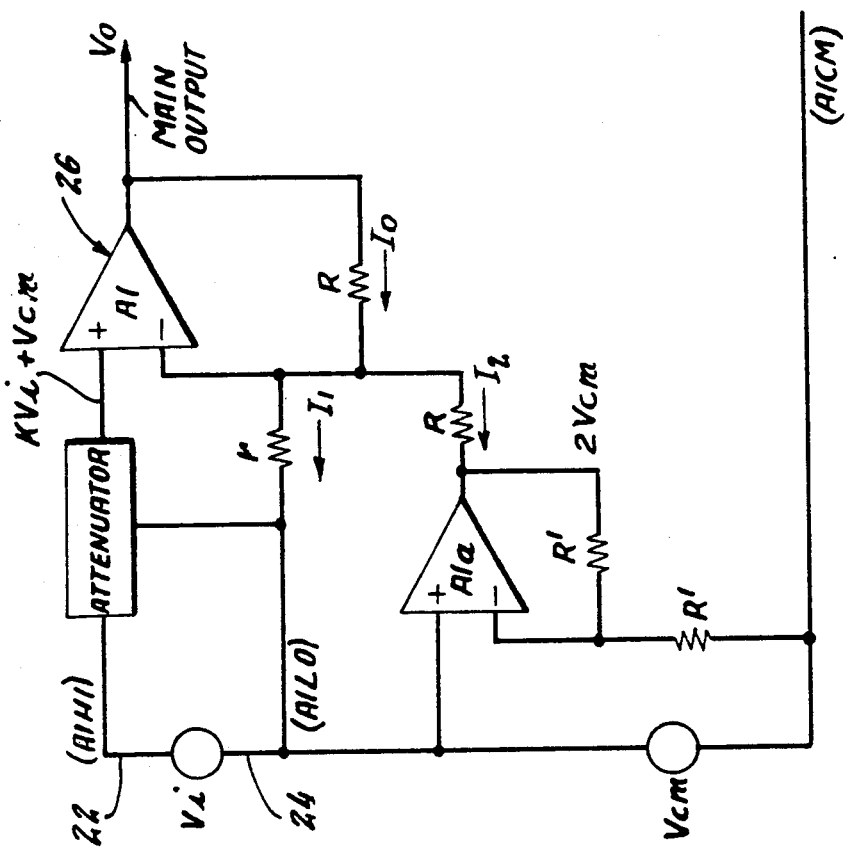
FIG. 12 is a block diagram illustrating the common-mode rejection function.

FIG. 12 is a block diagram to further illustrate the common-mode (CM) rejection function. The CM amplifier comprises A1a, R', R' and R. The main amplifier 26 compriese A1, R and r. The desired input, Vi, appears between terminal A1HI and A1LO and is attenuated by a factor K. At A1LO there is assumed to be an undesired common mode signal, Vcm, which is to be rejected. The output, Vo, appears between terminal A1HI and A1CM. A1 is the main amplifier stage; A1a is an auxiliary amplifier which provides a gain of exactly two to the voltage Vcm.

The input to the noninverting input of A1 is KVi+Vcm. This voltage is essentially replicated at the inverting input. The output of A1a is simply 2 Vcm. Thus, the current I1 is just KVi/r and the current I2 is (KVi−Vcm)/R. The sum of these currents is Io, which is equal to (Vo−Kvi−Vcm)/R. Therefore, $$KVi/r + (KVi - Vcm)/R = (Vo - KVi - Vcm)/R$$

and the terms due to Vcm are seen to cancel, leaving $$Vo = GkVI$$

where the gain, G, is set by the ratio of R and r.

For many applications, it may be desirable to provide a variable-gain amplifier in the form of two essentially identical channels, which can for example be connected in cascade as shown in FIG. 13. In such an arrangement, each of the two channels (CH1 and CH2) is a single variable-gain amplifier of the kind shown in FIG. 7. FIGS. 13a, b and c show such an arrangement under different control-signal conditions, providing gains of zero, 40 dB and 80 dB respectively. More particularly, in this configuration, the gain control signals to the two channels are offset by 40 dB. This can be achieved by driving C1HI and C2HI in parallel, and biasing C1LO and C2LO to appropriately different voltages (for example, in the preferred embodiment C1LO is set to 592 mV and C2LO to 1.908 V. When the gain control voltage Vg is zero, the gain is minimum. When Vg has reached 1.25 V, the gain of CH1 has increased by 40 dB. Thereafter the gain of CH2 increases to its final value of +40 dB when Vg=+2.5 V. Gain error and gain scaling remain unaffected in this sequential mode.

The two-channel system can also be operated with the two channels controlled in parallel. That is, C1HI and C2HI are connected together to the gain-control voltage Vg, and C1LO and C2LO are connected to a bias voltage (e.g., +625 mV). This doubles the gain scaling (to 64 dB/V in the preferred embodiment). A low-ripple mode may also be used, wherein the two gain control inputs are driven together, but offset, as by 3 dB, which is just half the period of the gain-ripple characteristic in the preferred embodiment.

One of the special advantages of the present invention is its ability to accommodate a high-speed sweep of the total gain range, a feature frequently required in imaging applications. The performance nevertheless remains quite linear over the entire range. A two-channel arrangement as described above provides a very large dynamic range.

The transconductance of a differential pair (as used in the above-described $g_m$ stages) is directly proportional to the magnitude of the current in the common emitters. However, such linearity is not a requirement for proper functioning of the variable-gain amplifier. That is, there is no requirement for a particular controlling law. It is only necessary that the response of the segment stages be controllably varied over a range from very low to some maximum value. Although bipolar transistors are used in the preferred embodiment, other kinds of devices can be employed to achieve the needed function. For example, the $g_m$ stages may employ NPN or PNP bipolar transistors, NMOS or CMOS transistors or gallium-arsenide FETs.

Although preferred embodiments of the invention have been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. A variable-gain amplifier comprising:
   a resistive attenuator including an input circuit to receive an input signal and having a series of nodes producing progressively attenuated signals corresponding to said input signal;
   a plurality of controllable response stages each having its input coupled to one of said attenuator nodes;
   gain-control means responsive to an analog control signal for varying the response of each of said response stages so that as the control signal is swept through its full range the response of each of said stages in succession is increased smoothly to a peak and thereafter decreased smoothly to a lower level; and an output circuit having an input receiving the composite outputs of said response stages so as to provide a corresponding composite output signal.

2. A variable-gain amplifier as in claim 1, wherein said gain-control means comprises means to generate a control current and to steer said control current to said response stages in sequence as said control signal is swept through its full range;

the response of said response stages being controllable by said control current to increase/decrease the response of each in response to a change of the magnitude of the control current directed to such stage through its control range for that stage.

3. A variable-gain amplifier as in claim 2, wherein each of said stages comprises a differential pair of transistors.

4. A variable-gain amplifier as in claim 3, wherein said stages comprise pairs of bipolar transistors with common emitters.

5. A variable-gain amplifier as in claim 4, wherein the response of said differential pairs is controlled by said control current steered to the common emitters of said transistors.

6. A variable-gain amplifier as in claim 1, wherein each of said stages include a pair of input terminals, one of said terminals for each stage being connected to a corresponding one of said nodes, the other of said input terminals being connected to a feedback network for said output circuit.

7. A variable-gain amplifier as in claim 1, wherein said controllable response stages comprise $g_m$ stages effective in respective successive segments of the gain range of the variable-gain amplifier.

8. A variable-gain amplifier as in claim 7, wherein said gain-control means generates a control current which is steered to said $g_m$ stages so as to control the transconductance of each to provide a smooth decrease in amplifier output as the control signal is varied from one limit value to the other limit value.

9. A variable-gain amplifier as in claim 8, including a current source for generating said control current at a fixed value;

said gain-control means serving to steer said fixed-value control current to said $g_m$ stages in successive sequence as the control signal is varied from minimum to maximum.

10. A variable-gain amplifier as in claim 9, wherein said $g_m$ stages each comprises a differential pair of transistors having common electrodes to receive a distributed portion of said control current and to control the respective transconductance in accordance with the magnitude of said portion.

11. A variable-gain amplifier as in claim 1, including a common-mode rejection amplifier coupled to the input of said attenuator to provide for rejection of common-mode signals.

12. A variable-gain amplifier as in claim 1, wherein said output circuit comprises a fixed-gain amplifier.

13. The method of controlling the overall gain of an attenuation system including an output circuit; said method comprising:

directing an input signal to an attenuator having a number of output nodes developing outputs progressively attenuated with respect to the input signal;

directing said outputs to respective controllable-response stages having outputs all coupled to said output circuit; and controlling the responses of said controllable-response stages by a continuously-variable analog control signal, the respective stages being smoothly activated from an initial response state to a maximum response state and then smoothly deactivated to a lower response state in sequence as the control signal is varied from one end to the other end of its full range.

14. The method of claim 13, including the step of controlling the responses of said stages by directing thereto a steerable control current which increases/decreases the $g_m$ of each stage in sequence as it is steered successively to said stages in sequence.

* * * * *